(12) United States Patent
Marsh et al.

(10) Patent No.: US 6,541,067 B1
(45) Date of Patent: *Apr. 1, 2003

(54) SOLVATED RUTHENIUM PRECURSORS FOR DIRECT LIQUID INJECTION OF RUTHENIUM AND RUTHENIUM OXIDE AND METHOD OF USING SAME

(75) Inventors: Eugene P. Marsh, Boise, ID (US); Stefan Uhlenbrock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/506,962

(22) Filed: Feb. 18, 2000

Related U.S. Application Data

(63) Continuation-in-part of application No. 09/140,878, filed on Aug. 27, 1998, now Pat. No. 6,074,945, and a continuation-in-part of application No. 09/140,932, filed on Aug. 27, 1998, now Pat. No. 6,133,159.

(51) Int. Cl.[7] .............................................. C23C 16/16
(52) U.S. Cl. ................... 427/252; 427/255.31; 427/901; 438/681; 438/686; 438/758; 438/778
(58) Field of Search .......................... 427/99, 124, 250, 427/252, 255.31, 901; 438/681, 686, 758, 778

(56) References Cited

U.S. PATENT DOCUMENTS

| | | | |
|---|---|---|---|
| 4,250,210 A | 2/1981 | Crosby et al. | |
| 4,982,309 A | 1/1991 | Shepherd | |
| 5,130,172 A | 7/1992 | Hicks et al. | |
| 5,204,314 A | * 4/1993 | Kirlin et al. | ................ 117/102 |
| 5,314,727 A | 5/1994 | McCormick et al. | |
| 5,352,488 A | 10/1994 | Spencer et al. | |
| 5,372,849 A | 12/1994 | McCormick et al. | |
| 5,618,761 A | 4/1997 | Eguchi et al. | |
| 5,637,533 A | 6/1997 | Choi | |
| 5,820,664 A | * 10/1998 | Gardiner et al. | ........ 106/287.17 |
| 5,980,983 A | * 11/1999 | Gordon | ..................... 106/1.25 |
| 6,063,705 A | * 5/2000 | Vaartstra | ...................... 427/252 |
| 6,074,945 A | 6/2000 | Vaartstra et al. | |
| 6,133,159 A | 10/2000 | Vaartstra et al. | |
| 6,284,654 B1 | * 9/2001 | Roeder et al. | .............. 438/240 |
| 6,316,064 B1 | * 11/2001 | Onozawa et al. | ........... 427/250 |

FOREIGN PATENT DOCUMENTS

JP   11-317377   * 11/1999

OTHER PUBLICATIONS

Cowles et al., *Chemical Communications*, p. 392 (no month).
Green et al., "Chemical Vapor Deposition of Ruthenium and Ruthenium Dioxide Films", *J. Electrochem. Soc.*, vol. 132, No. 111, pp. 2677–2685, Nov. 1985.
Liao et al., "Characterization of $RuO_2$ thin films depositied on Si by metal–organic chemical vapor deposition", *Thin Solid Films* 287, pp. 74–79, 1996.

* cited by examiner

Primary Examiner—Timothy Meeks
(74) Attorney, Agent, or Firm—TraskBritt

(57) ABSTRACT

A method is provided for forming a film of ruthenium or ruthenium oxide to the surface of a substrate by employing the techniques of chemical vapor deposition to decompose ruthenium precursor formulations. The ruthenium precursor formulations of the present invention include a ruthenium precursor compound and a solvent capable of solubilizing the ruthenium precursor compound. A method is further provided for making a vaporized ruthenium precursor for use in the chemical vapor deposition of ruthenium and ruthenium-containing materials onto substrates, wherein a ruthenium precursor formulation having a ruthenium-containing precursor compound and a solvent capable of solubilizing the ruthenium-containing precursor compound is vaporized.

43 Claims, 1 Drawing Sheet

US 6,541,067 B1

SOLVATED RUTHENIUM PRECURSORS FOR DIRECT LIQUID INJECTION OF RUTHENIUM AND RUTHENIUM OXIDE AND METHOD OF USING SAME

CROSS REFERENCE TO RELATED APPLICATIONS

This application is a continuation-in-part (CIP) of application Ser. No. 09/140,878, filed Aug. 27, 1998, U.S. Pat. No. 6,074,945, and application Ser. No. 09/140,932, filed Aug. 27, 1998, U.S. Pat. No. 6,133,159.

BACKGROUND OF THE INVENTION

1. Field of the Invention

The present invention relates to chemical vapor deposition of films of ruthenium. More particularly, the invention relates to direct liquid injection of precursor solutions of ruthenium compounds for use in chemical vapor deposition of ruthenium and ruthenium oxide. The invention further relates to solvated ruthenium precursor formulations suitable for forming vaporized ruthenium precursors for use in chemical vapor deposition of ruthenium films onto substrates.

2. State of the Art

Use of chemical vapor deposition ("CVD") methods for depositing a thin film of material on a substrate, such as a silicon wafer or other exposed material surface on a wafer or other semiconductor base, are widely known and used in the semiconductor fabrication industry. In typical CVD processes, a precursor, such as a heat decomposable volatile compound, is contacted with a substrate which has been heated to a temperature above the decomposition temperature of the precursor. In this fashion, a coating, which typically comprises a metal, metal mixture or alloy, ceramic, metal compound, or a mixture thereof, depending on the choice of precursors and reaction conditions, is formed on the substrate.

Use of CVD as a thin film formation method includes numerous desirable characteristics, such as the ability to readily control the composition of the thin film and the ability to form a thin film without contamination of, or damage to, the substrate. CVD may also be used to deposit films of metals into vias, trenches, and other recesses or stepped structures. In situations where conformal thin-film deposition is required, CVD techniques are a preferred method of deposition, since evaporation and sputtering techniques cannot be used to form a conformal thin-film deposition layer.

While CVD techniques have been described in the literature with reference to many metals and metalloids, commercial use of CVD has been predominantly confined to deposition of a few metals and metal compounds, such as tungsten, silicon, titanium nitride, silicon oxide, iron, and aluminum. CVD of other metals has been limited due to a variety of reasons, including formation of poor film quality, requirement of high processing temperatures, lack of suitable precursor compounds, and instability of the precursors used in the deposition systems. The availability of suitable volatile and heat-decomposable precursor compounds appears to be a significant limiting factor in the application of CVD to the production of metal-containing films.

In integrated circuit processing, selected precursor compounds have been used to form conducting films that can maintain their integrity at elevated temperatures. Ruthenium and ruthenium dioxide ($RuO_2$) are particularly well-suited as conducting films for such applications since they have good electrical conductivities, exhibit high stability over a wide temperature range and exhibit good adherence to silicon, silicon dioxide, and ceramic oxides. Films of ruthenium and ruthenium oxide deposited by CVD have been proposed to be useful for contact metallizations, diffusion barriers, and gate metallizations. M. L. Green et al., *J. Electrochem. Soc.*, 132, 2677 (1985).

There are a wide variety of ruthenium compounds that can be used as precursors for the preparation of such films. Many are particularly well suited for use in chemical vapor deposition techniques. For example, U.S. Pat. No. 5,372,849 to McCormick et al. discloses the use of ruthenium compounds containing carbonyl ligands and other ligands. However, such compounds are typically less volatile and not as easily used in chemical vapor deposition techniques.

Another use of ruthenium precursors for the preparation of films involves use of a chemical spray deposition process wherein tris(acetylacetonate)ruthenium in butanol is converted into an aerosol spray using a hydrogen/nitrogen mixture as the carrier gas. Triruthenium dodecacarbonyl, ruthenocene, and tris(acetylacetonate)ruthenium have also been compared as CVD precursors in the formation of ruthenium and $RuO_2$ by M. Green et al., in *J. Electrochem. Soc.*, 132, 2677 (1985). However, because none of the aforementioned precursors are very volatile, high deposition rates using these precursors are difficult to obtain.

U.S. Pat. No. 4,250,210, issued Feb. 10, 1981 to Crosby et al., discloses the use of ruthenium 1,3 dione compounds, such as tris(acetylacetonate)ruthenium and its fluorinated derivatives, in the CVD of ruthenium films. Although the fluorinated ligands are said to provide greater volatility and good deposition rates when heated to over 200° C., difficulties in attaining uniform coatings are noted due to the poor stability of the precursors. Furthermore, organic byproducts with very low vapor pressures are formed and collect in the reactor during the volatilization process, which can create a serious contamination problem in production-scale applications of the tris(acetylacetonate)ruthenium precursors.

Also disclosed in the Crosby patent is the use of ruthenium carbonyl chloride and penta(trifluorophosphine) ruthenium as precursors for ruthenium CVD. Use of these precursor compounds, however, is undesirable because the obtainable rates of deposition of ruthenium are very low and ruthenium carbonyl chloride corrodes certain substrates, making a consistent product preparation difficult or impossible.

In view of the described shortcomings, it would be useful to utilize ruthenium precursor formulas having both high stability and high volatility that are easy to prepare and use in low temperature CVD processes and which are capable of depositing high-quality, continuous films of ruthenium having good surface morphology. While many ruthenium precursor compounds possessing such characteristics are known, those same compounds typically have freezing points around room temperature. Thus, in order to prevent these ruthenium precursor compounds from freezing, the system typically needs to be heated. Using a solution of ruthenium precursor compounds in an organic solvent instead of the neat precursor for a liquid delivery system would eliminate the necessity of heating the direct liquid injection (DLI) system. These same precursor compounds, however, are usually very temperature sensitive, with heating at slightly elevated temperatures resulting in the decomposition of the precursor. Side products of this decomposition are solids, which are detrimental to a liquid delivery process as well. Also measuring and controlling extremely small amounts (e.g., microliter/min) of ruthenium precursors is very difficult.

Thus, in view of the shortcomings of the available precursors, a continuing need exists for improved ruthenium precursor formulations useful for the CVD of films of ruthenium and ruthenium-containing films (e.g., $RuO_2$, $SrRuO_3$, $RuSi_x$). More specifically, a need exists for high-volatility ruthenium precursor formulations that are highly stable, maintain a ruthenium precursor in a soluble state, and do not require heating of the precursor formulation prior to introducing the same into a CVD system. The precursor formulations should also be easy to prepare, easy to measure, convenient to use in low-temperature CVD processes, and available in more manageable delivery forms (i.e., ml/min rate).

SUMMARY OF THE INVENTION

The present invention provides a method for applying a film of ruthenium or ruthenium oxide to the surface of a substrate by employing the techniques of chemical vapor deposition (CVD) to decompose stable ruthenium precursor formulations which include a Ru precursor compound dissolved in a solvent capable of solubilizing the Ru precursor compound.

The method of the present invention provides an improved CVD technique wherein continuous Ru films of high quality and good surface morphology can be deposited at low temperatures by utilizing the aforementioned Ru formulations as precursors in the CVD process. In the absence of an oxygen source, the deposited films consist essentially of Ru in that they contain only minor amounts of residual elements, thus forming essentially pure films of Ru. The aforementioned precursor formulations may be used as neat liquids, in mixtures, or in additional solvents for delivery by liquid injection\flash evaporation techniques.

The present invention also provides a CVD method where the precursor formulations either contain significant amounts of oxygen or are used in combination with reactive carrier gases (e.g., oxidizers such as $O_2$ or $N_2O$) to deposit films of $RuO_2$. Ruthenium metal deposited on a polysilicon electrode can also be subjected to post-deposition rapid thermal oxidation (RTO) to cause siticidation of the bottom layer and oxidation of the top layer of the Ru film. This layer configuration can also be formed by depositing Ru metal first (to be later silicided) and then forming an oxide thereon either in situ, through the addition of an oxidizer, or by post deposition anneal.

Alternating layers of essentially pure Ru and of $RuO_2$ can also be deposited on a single substrate by selecting and alternating the precursors or reactive carrier gases present in the environment during the CVD process(es).

The method of the present invention further provides a technique for making a vaporized ruthenium precursor for use in CVD of ruthenium and ruthenium-containing films onto substrates wherein a ruthenium precursor formulation, having a ruthenium-containing precursor compound and a solvent capable of solubilizing the ruthenium-containing precursor compound, is vaporized.

DETAILED DESCRIPTION OF THE PREFERRED EMBODIMENTS

A. Ruthenium Precursor Formulations

Figure 1:
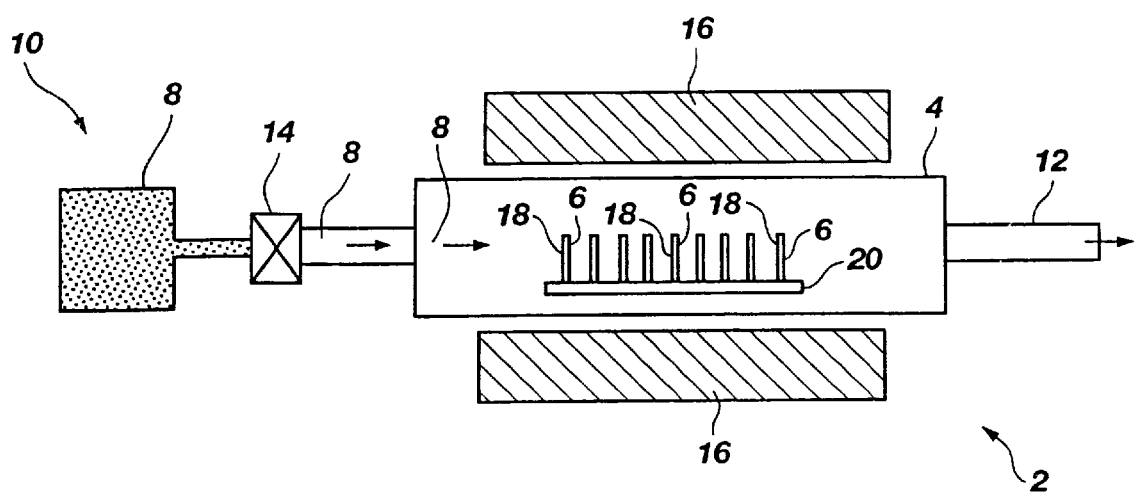
FIG. 1 is a schematic of a chemical vapor deposition system suitable for use in the method of the present invention.

In the present invention, ruthenium precursor formulations include a ruthenium-containing precursor compound and a solvent capable of solubilizing the ruthenium-containing precursor compound. Illustrative examples of precursor compounds which can be used in the Ru precursor formulation of the instant invention include cyclopentadienetricarbonyl ruthenium, cyclohexadienetricarbonyl ruthenium, cycloheptadienetricarbonyl ruthenium, norbornadiene tricarbonyl ruthenium, cyclohexadienetetracarbonyl ruthenium, diethylenetricarbonyl ruthenium, dipropylene tricarbonyl ruthenium, and allyltetracarbonyl ruthenium. Illustrative examples of solvents which can be used in the ruthenium precursor formulation of the instant invention include hexane, hexanes (e.g., a mixture of hexane isotopes), pentane, heptane, butylacetate, and derivatives and combinations thereof. It is understood that solvents suitable for use in the present invention include any organic or inorganic solvent which solubilizes ruthenium-containing precursor compounds without decomposing the same.

It has been found that the ruthenium precursor formulations and solutions of the present invention prevent the ruthenium precursor compounds from freezing at room temperature, thus, eliminating the need to heat delivery lines of the CVD apparatus and the resulting decomposition of the ruthenium precursor compounds during the heating process. Additionally, solvating the ruthenium precursor compounds increases the precision of the delivery system by increasing the delivery from an inconvenient measurement rate for the neat compound, such as a microliter/min rate, to a more advantageous measuring rate, such as a ml/min rate used with the ruthenium precursor formulations of the present invention.

B. The CVD Process

The invention broadly relates to use of CVD to deposit high-quality films of Ru at low temperatures on the surface of a substrate and, more particularly, to DLI of precursor solutions into a vaporizer for use in a CVD process. Methods of the present invention are particularly well suited for CVD processes employing vapor deposition techniques, such as flash vaporization.

The invention can be carried out through any number of known CVD processes requiring vaporization of precursors. Following vaporization of the precursor formulations, CVD processes may be modified by altering such variables as, for example, the heating method, gas pressure, and/or chemical reaction. Conventional CVD methods suitable for use with the solvated Ru precursors of the present invention include both cold-wall type CVD, wherein only a deposition substrate is heated through any number of methods such as induction heating or use of hot stages. Alternatively, hot-wall type CVD, in which an entire reaction chamber is heated, can be used. The CVD processes can also vary with respect to pressure requirements and may include atmospheric CVD, in which the reaction occurs at a pressure of about one atmosphere, or low-pressure CVD, in which reaction occurs at pressures between about $10^{-1}$ to about 100 torr.

It is understood that the CVD process can be carried out in any type of apparatus in which the substrate and/or the Ru precursor is heated. CVD apparatus designs suitable for use in the precursor formulations of the present invention include, but are not limited to, hot wall reactors, cold wall reactors, plasma-assisted reactors, radiation beam assisted reactors, and the like. One such suitable CVD apparatus design, in the form of a horizontal tube CVD reactor, is schematically depicted in FIG. 1.

As shown in FIG. 1, a typical CVD process begins with the placement of substrate 6, on which deposition is to occur, within reaction chamber 4 of reactor 2. One or more units of substrate 6 can be held in place within reaction chamber 4 in, for example, a vertical position, by a suitable holder 20. Substrate 6 is then heated to a temperature sufficient to decompose and vaporize the precursor complex. A vacuum (not shown), which can be created by any suitable vacuum pump, can be provided at opposite end 12 of reaction chamber 4 to create a vacuum within reaction chamber 4. Precursor vapor 8 is introduced into reservoir 10 located at one end of reactor 2 and exposed to a vacuum by opening valve 14 located between reaction chamber 4 and reservoir 10.

It should be understood that the ruthenium precursor formulations may be vaporized in reservoir 10 or introduced into reservoir 10 as a pre-vaporized precursor. Regardless of where vaporization takes place, a preferred method for vaporization of the Ru precursors for CVD is DLI of the solvated Ru precursor formulations into a flash vaporizer. It has been found that DLI of Ru precursor solutions of the instant invention allows increased deposition rates for thermally unstable compounds and facilitates the monitoring of material consumption.

Following vaporization, precursor vapor 8 then passes into reaction chamber 4 containing one or more units of substrate 6. Reaction chamber 4 is maintained at a preselected temperature, by means of a furnace 16, which is effective to decompose precursor vapor 8 so as to deposit a film 18 containing Ru on the exposed surfaces of substrate 6.

Generally, a thermal reactor CVD system can be used to heat the substrate to a temperature in excess of the decomposition temperature of the selected Ru precursor. Thermal CVD may be effected within any type of apparatus in which the substrate and/or the precursor is heated. By heating the substrate at a sufficiently high temperature, the decomposition reaction occurs at the surface of this substrate. Likewise, in an energy-beam induced CVD technique, an energy source (i.e., ion beam) is advantageously used to heat the substrate such that the decomposition of the precursor occurs predominantly at the substrate surface.

Use of these thermal CVD processes can provide blanket deposition of Ru on substrates. Additionally, selected area depositions of Ru may be accomplished by using a masking material (e.g., resist material) in conjunction with the thermal CVD process or by utilizing a more selective thermal CVD process, such as an energy-beam assisted CVD to selectively heat specific portions of the substrate upon which deposition or "writing" of Ru will be performed.

Many of the processes used for CVD of Ru utilize low pressure systems. However, no criticality with respect to the pressure in the system exists in practicing the present invention. While typical operating pressures range from about 0.1 to about 10 torr, higher or lower pressures are also acceptable. These variations in pressure are largely determined by a number of factors, such as resultant film conformity, the vapor pressure of the Ru precursor compound, the evacuation speed and efficiency of the vacuum equipment, and physical characteristics of inert carrier gases that can be added to adjust the total pressure.

The growth of a pure ruthenium film can be conducted by utilizing any of the aforementioned CVD methods and apparatus designs, using a solvated ruthenium precursor formulation under conditions wherein reactive gases are absent. Alternatively, $RuO_2$ films can be formed by contacting any of the vaporized Ru precursor formulations with a heated substrate in the presence of an oxidizing agent. The oxidizing agent may be any gaseous reactant which is capable of reacting with the solvated Ru precursor compounds at the decomposition temperatures of the latter to form Ru oxide deposits. Suitable oxidizing agents for use with the present method include, but are not limited to, air, oxygen, and oxygen-containing compounds, such as nitrous oxide, ozone, hydrogen peroxide, tetrahydrofuran, water, carbon dioxide, sulfur dioxide, sulfur trioxide (sulfuric anhydride), organic peroxides, and are preferably selected from mildly oxidizing gaseous oxygen sources.

Oxidizing agents may alternatively be introduced into the reactor in combination with a carrier gas. The present method produces conductive $RuO_2$ films on substrates, such as silicon, when the depositions are carried out in atmospheres containing the aforementioned oxidizing agents. X-ray photoelectron spectroscopy (XPS) reveals the deposition of a pure $RuO_2$ film from $(C_6H_8)Ru(CO)_3$, the $RuO_2$ film exhibiting a constant oxygen concentration throughout the depth of the deposited film.

The instant process can be modified by depositing the Ru metal first, forming the oxide in situ by oxidizing the Ru metal through any of the oxidizing processes described herein, and siliciding the bottom layer of Ru metal. Alternatively, the Ru layer can be oxidized by post deposition anneal.

Various other modifications to the process of the instant invention are envisioned. For example, other metals, alloys, and mixtures thereof can also be incorporated into the solvated precursor formulations and deposited, together with Ru or $RuO_2$, onto a substrate. Where non-oxidized Ru metal-containing films are desirable, the deposition is carried out under nonoxidizing conditions. Alternatively, the deposition can be carried out using relatively low flows of oxidizers or weak oxidizing agents, such as $N_2O$.

The processes described herein result in high-quality Ru films which can be deposited at various thicknesses. The thickness of the deposited layer can be modified by controlling a number of variables, such as the vaporization rate for the Ru precursor formulation, the time and temperature of deposition, the flow rate of the vapor of the Ru precursor, the length of contact time between the substrate and the Ru precursor compounds, and the volatility of the specific Ru precursor and solvent selected. Products and structures manufactured according to the process of this invention can be made to have any desired Ru-containing layer thickness. A preferred range of thickness for semiconductor or electronic applications is from a monomolecular layer to about 0.1 micron.

The processes described herein are useful to deposit Ru and ruthenium-containing materials (e.g., $RuO_2$, RuIr, $SrRuO_3$, $RuSi_x$, Ru alloys, etc.) onto a substrate, such as a semiconductor substrate, to create diffusion barriers, electrode materials, semiconductor dopants, contact metallizations, interconnection traces, and the like. Any of the processes described herein advantageously provide low-temperature deposition of Ru and $RuO_2$-containing layers having conformal coverage and excellent step coverage.

The present invention will be understood more fully from the description which follows, and from the accompanying examples, in which particular embodiments of the process of the invention are described. It is to be understood at the outset, however, that persons of ordinary skill in the appropriate arts may modify the invention herein described while still achieving the favorable results of this invention.

Accordingly, the description and examples which follow are to be understood as being a broad teaching disclosure directed to persons of ordinary skill in the appropriate arts, and are not to be understood as limiting upon the present invention. The scope of the invention is to be determined by the appended claims.

EXAMPLE I

Preparation of Solvated Tricarbonyl [(1,2,3,4-η)-1, 3-cyclohexadiene] ruthenium

Tricarbonyl [(1,2,3,4-η)-1,3-cyclohexadiene] ruthenium (hereinafter "$(C_6H_8)Ru(CO)_3$") was prepared by mixing 10 gm of $Ru_3(CO)_{12}$ (Strem Chemicals, Inc., Newburyport, Mass.), 30 mls of benzene (Aldrich Chemical Co., Milwaukee, Wis.), and 13.5 ml of 1,3-cyclohexadiene (9 equivalents, 0.141 mol) (Aldrich Chemical Co., Milwaukee, Wis.) in a glass flask. The resulting solution was heated to 80° C. and refluxed for 48 hours, at which point the solution turned yellow in color.

Refluxing was halted, the flask was isolated and attached to a vacuum line, and the bulk of the benzene was then removed from the flask. The remaining portion of the solution was cannula transferred to a mini-distillation apparatus, where a pressure in manifold of about 6 Torr was established. Remaining amounts of benzene and 1,3-cyclohexadiene were removed by warming the contents of the flask by heating a mantle to about 30° C. The flask was then heated to about 60° C. under static vacuum and the receiver was cooled in order to remove the product of the reaction, a slightly yellow-colored oil of $(C_6H_8)Ru(CO)_3$. 2.65 grams of $(C_6H_8)Ru(CO)_3$ (0.01 mole) were added to a 0.10 liter volumetric flask at room temperature (approximately 20–25° C. (68–77° F.)) and hexanes (a mixture of hexane isotopes) were added to obtain a total volume of 0.10 liters of 0.1M solution of $(C_6H_8)Ru(CO)_3$ in hexanes.

EXAMPLE II

Ruthenium Film Deposition from $(C_6H_8)Ru(CO)_3$ solution

The precursor $(C_6H_8)Ru(CO)_3$ solution, prepared according to the description of Example I, was delivered into a flash vaporizer at a concentration of 0.1M and at a rate of 0.24 ml/min using a syringe pump. A wafer of p-type silicon was placed in the CVD chamber and heated to 190° C. (as measured by a thermocouple in direct contact with the surface of the wafer). Concurrently with the heating of the wafer, the chamber pressure was stabilized at 5.0 Torr and 50 sccm of He used to deliver the $(C_6H_8)Ru(CO)_3$ vapor to the chamber. The chamber was evacuated, and the wafer was cooled to room temperature.

A smooth, highly reflective coating of metallic Ru was formed on the wafer. X-ray photoelectron spectroscopy (XPS) was used to profile the film deposited on the wafer. XPS revealed a pure Ru film having a thickness of approximately 1700 Å.

EXAMPLE III

Ruthenium Oxide Film Deposition from $(C_6H_8)Ru(CO)_3$

Deposition of $RuO_2$ is carried out using a similar method to that described in Example II, except that $O_2$ at 50 sccm is added to the He used to deliver the $(C_6H_8)Ru(CO)_3$ vapor to the chamber. A one-minute deposition is then carried out and the wafer is allowed to cool to room temperature. A smooth, highly reflective coating of metallic $RuO_2$ is formed on the wafer.

What is claimed is:

1. A method of fabricating a semiconductor structure, the method comprising:
    providing a semiconductor substrate;
    providing a ruthenium precursor formulation comprising tricarbonyl(1,2,3,4-η)-1,3-cyclohexadiene ruthenium dissolved in a solvent capable of solubilizing said ruthenium-containing precursor compound;
    vaporizing said ruthenium precursor formulation to form a vaporized precursor compound; and
    directing said vaporized precursor compound toward said semiconductor substrate or to form a ruthenium film on a surface of the semiconductor substrate.

2. The method of claim 1, further comprising providing said tricarbonyl(1,2,3,4-η)-1,3-cyclohexadiene ruthenium as a liquid.

3. The method of claim 1, further comprising providing said tricarbonyl(1,2,3,4-η)-1,3-cyclohexadiene ruthenium to have a freezing point around room temperature.

4. The method of claim 1, wherein said tricarbonyl(1,2, 3,4-η)-1,3-cyclohexadiene ruthenium decomposes at a temperature greater than room temperature.

5. The method of claim 1, further comprising selecting the semiconductor substrate from the group consisting of a semiconductor wafer, a semiconductor on an insulator substrate, a semiconductor on a sapphire substrate, a semiconductor on a metal substrate, a semiconductor on a nitride, and a semiconductor on a conducting layer.

6. The method of claim 1, further comprising vaporizing the ruthenium precursor formulation using a hot wall type chemical deposition technique.

7. The method of claim 1, further comprising vaporizing the ruthenium precursor formulation using a cold wall type chemical deposition technique.

8. The method of claim 1, further comprising containing the semiconductor substrate within a reaction chamber having a pressure of about 0.1 torr to about 10 torr.

9. The method of claim 1, further comprising containing the semiconductor substrate within a reaction chamber having a pressure of about 1 atmosphere.

10. The method of claim 1, further comprising providing said ruthenium precursor formulation to further contain an oxidizing agent.

11. The method of claim 1, further comprising providing said tricarbonyl(1,2,3,4-η)-1,3-cyclohexadiene ruthenium to further contain oxygen.

12. The method of claim 1, further comprising directing said vaporized tricarbonyl(1,2,3,4-η)-1,3-cyclohexadiene ruthenium in combination with at least one oxidizing gas toward the semiconductor substrate to form a ruthenium oxide film on a surface of the semiconductor substrate.

13. The method of claim 12, further comprising providing oxygen as said at least one oxidizing gas.

14. The method of claim 12, further comprising selecting said at least one oxidizing gas from the group of $O_2$, $N_2O$, $O_3$, $NO$, $NO_2$, $H_2O_2$, $H_2O$, $SO_2$, $SO_3$, organic peroxides, and combinations thereof.

15. The method of claim 1, further comprising injecting said ruthenium precursor formulation into a vaporizer to vaporize said ruthenium precursor formulation.

16. The method of claim 1, further comprising injecting said ruthenium precursor formulation into a flash vaporizer to vaporize said ruthenium precursor formulation.

17. The method of claim 1, further comprising selecting said solvent from the group consisting of hexane, hexanes, pentane, heptane, and butylacetate.

18. A method of making a vaporized ruthenium precursor for use in chemical vapor deposition of ruthenium films onto substrates comprising:

providing a ruthenium precursor formulation comprising tricarbonyl(1,2,3,4-η)-1,3-cyclohexadiene ruthenium and a solvent capable of solubilizing said ruthenium-containing precursor compound; and vaporizing said ruthenium precursor formulation to form a vaporized precursor compound.

19. The method of claim 18, further comprising providing said tricarbonyl(1,2,3,4-η)-1,3-cyclohexadiene ruthenium as a liquid.

20. The method of claim 18, further comprising selecting said tricarbonyl(1,2,3,4-η)-1,3-cyclohexadiene ruthenium to have a freezing point around room temperature.

21. The method of claim 18, further comprising selecting said tricarbonyl(1,2,3,4-η)-1,3-cyclohexadiene ruthenium to have a temperature of decomposition greater than room temperature.

22. The method of claim 18, further comprising providing said ruthenium precursor formulation to contain an oxidizing agent.

23. The method of claim 18, further comprising providing said tricarbonyl(1,2,3,4-η)-1,3-cyclohexadiene ruthenium to further contain oxygen.

24. The method of claim 18, further comprising injecting said ruthenium precursor formulation into a vaporizer to vaporize said ruthenium precursor formulation.

25. The method of claim 18, further comprising injecting said ruthenium precursor formulation into a flash vaporizer to vaporize said ruthenium precursor formulation.

26. The method of claim 18, further comprising selecting said solvent from the group consisting of hexane, hexanes, pentane, heptane, and butylacetate.

27. A method of manufacturing a semiconductor structure, the method comprising:

providing a semiconductor substrate or substrate assembly;

providing a ruthenium precursor formulation comprising cyclohexadienetricarbonyl ruthenium dissolved in a solvent capable of solubilizing said cyclohexadienetricarbonyl ruthenium;

vaporizing said ruthenium precursor formulation to form a vaporized precursor compound; and directing said vaporized precursor compound toward said semiconductor substrate or substrate assembly to form a ruthenium film on a surface of the semiconductor substrate or substrate assembly.

28. The method of claim 27, further comprising injecting said ruthenium precursor formulation into a flash vaporizer to vaporize said ruthenium precursor formulation.

29. The method of claim 27, further comprising selecting said solvent from the group consisting of hexane, hexanes, pentane, heptane, and butylacetate.

30. The method of claim 27, further comprising selecting the semiconductor substrate from the group consisting of a semiconductor wafer, a semiconductor on an insulator substrate, a semiconductor on a sapphire substrate, a semiconductor on a metal substrate, a semiconductor on a nitride, and a semiconductor on a conducting layer.

31. The method of claim 27, further comprising selecting said ruthenium precursor formulation to contain an oxidizing agent.

32. The method of claim 27, further comprising providing said ruthenium precursor formulation to further contain oxygen.

33. The method of claim 27, further comprising directing said vaporized precursor compound in combination with at least one oxidizing gas toward the semiconductor substrate to form a ruthenium oxide film on a surface of the semiconductor substrate or substrate assembly.

34. The method of claim 33, further comprising providing oxygen as said at least one oxidizing gas.

35. The method of claim 33, further comprising selecting said at least one oxidizing gas from the group of $O_2$, $N_2O$, $O_3$, NO, $NO_2$, $H_2O_2$, $H_2O$, $SO_2$, $SO_3$, organic peroxides, and combinations thereof.

36. The method of claim 27, further comprising injecting said ruthenium precursor formulation into a vaporizer to vaporize said ruthenium precursor formulation.

37. The method of claim 27, wherein vaporizing said ruthenium precursor formulation comprises injecting said ruthenium precursor formulation into a flash vaporizer.

38. A method of making a vaporized ruthenium precursor for use in chemical vapor deposition of ruthenium films onto substrates comprising:

providing a ruthenium precursor formulation comprising cyclohexadienetricarbonyl ruthenium and a solvent capable of solubilizing said cyclohexadienetricarbonyl ruthenium; and vaporizing said ruthenium precursor formulation to form a vaporized precursor compound.

39. The method of claim 38, further comprising selecting said ruthenium precursor formulation to contain an oxidizing agent.

40. The method of claim 38, further comprising selecting said ruthenium precursor formulation to further contain oxygen.

41. The method of claim 38, further comprising injecting said ruthenium precursor formulation into a vaporizer to vaporize said ruthenium precursor formulation.

42. The method of claim 38, further comprising injecting said ruthenium precursor formulation into a flash vaporizer to vaporize said ruthenium precursor formulation.

43. The method of claim 38, further comprising selecting said solvent from the group consisting of hexane, hexanes, pentane, heptane, and butylacetate.

\* \* \* \* \*

UNITED STATES PATENT AND TRADEMARK OFFICE
CERTIFICATE OF CORRECTION

PATENT NO. : 6,541,067 B1
DATED : April 1, 2003
INVENTOR(S) : Eugene P. Marsh and Stefan Uhlenbrock It is certified that error appears in the above-identified patent and that said Letters Patent is hereby corrected as shown below:

Title page,
Item [56], References Cited, OTHER PUBLICATIONS, "Green et al.," change "111" to -- 11 --

Column 3,
Line 45, change "siticidation" to -- silicidation --

Column 5,
Line 7, delete the comma after "position"

Signed and Sealed this

Nineteenth Day of October, 2004

JON W. DUDAS
*Director of the United States Patent and Trademark Office*